United States Patent
Loopstra et al.

(10) Patent No.: US 9,958,787 B2
(45) Date of Patent: May 1, 2018

(54) LITHOGRAPHIC METHOD AND APPARATUS

(71) Applicant: ASML Netherlands B.V., Veldhoven (NL)

(72) Inventors: Erik Roelof Loopstra, Eindhoven (NL); Jan Bernard Plechelmus Van Schoot, Eindhoven (NL); Timotheus Franciscus Sengers, Veldhoven (NL); Christiaan Louis Valentin, Veldhoven (NL); Antonius Johannes Josephus Van Dijsseldonk, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days. days.

(21) Appl. No.: 14/428,023

(22) PCT Filed: Sep. 17, 2013

(86) PCT No.: PCT/EP2013/069262
§ 371 (c)(1),
(2) Date: Mar. 13, 2015

(87) PCT Pub. No.: WO2014/044670
PCT Pub. Date: Mar. 27, 2014

(65) Prior Publication Data
US 2015/0253679 A1    Sep. 10, 2015

Related U.S. Application Data

(60) Provisional application No. 61/704,144, filed on Sep. 21, 2012, provisional application No. 61/760,432, filed on Feb. 4, 2013.

(51) Int. Cl.
*G03B 27/52* (2006.01)
*G03F 7/20* (2006.01)

(52) U.S. Cl.
CPC ........ *G03F 7/70425* (2013.01); *G03F 7/7045* (2013.01); *G03F 7/70466* (2013.01); *G03F 7/70475* (2013.01)

(58) Field of Classification Search
CPC ............... G03F 7/70425; G03F 7/7045; G03F 7/70466; G03F 7/70475
See application file for complete search history.

(56) References Cited

U.S. PATENT DOCUMENTS 4,982,227 A * 1/1991 Suzuki ................ G03F 7/70358
355/46
5,281,996 A   1/1994 Bruning et al.
(Continued)

FOREIGN PATENT DOCUMENTS

EP    1 622 191 A1    2/2006
JP    07-161603 A     6/1995
(Continued)

OTHER PUBLICATIONS

International Search Report directed to related International Patent Application No. PCT/EP2013/069262, dated Mar. 12, 2014; 6 pages.
(Continued)

*Primary Examiner* — Deoram Persaud
(74) *Attorney, Agent, or Firm* — Sterne, Kessler, Goldstein & Fox P.L.L.C.

(57) ABSTRACT

A method of exposing a patterned area on a substrate using an EUV lithographic apparatus having a demagnification of about 5× and a numerical aperture of about 0.4 is disclosed. The method comprises exposing a first portion of the patterned area on the substrate using a first exposure, the first portion dimensions are significantly less than the dimensions of a conventional exposure, and exposing one or more additional portions of the patterned area on the substrate using one or more additional exposures, the additional
(Continued)

portions having dimensions which are significantly less than the dimensions of a conventional exposure. The method further comprises repeating the above to expose a second patterned area on the substrate, the second patterned area being provided with the same pattern as the first patterned area, wherein a distance between center points of the first and second patterned areas corresponds with a dimension of a conventional exposure.

19 Claims, 6 Drawing Sheets

(56) References Cited

U.S. PATENT DOCUMENTS

| | | | |
|---|---|---|---|
| 5,686,731 A * | 11/1997 | Wiles | G01N 21/57 |
| | | | 250/234 |
| 5,976,738 A * | 11/1999 | Nakashima | G03F 7/2022 |
| | | | 430/22 |
| 6,300,023 B1 | 10/2001 | Nakasuji | |
| 6,556,648 B1 | 4/2003 | Bal et al. | |
| 2002/0115004 A1 | 8/2002 | McCullough et al. | |
| 2003/0198787 A1 | 10/2003 | Kwan | |
| 2003/0218730 A1 | 11/2003 | Murakami et al. | |
| 2006/0087633 A1 * | 4/2006 | Omura | G03F 7/70241 |
| | | | 355/53 |
| 2006/0139586 A1 | 6/2006 | Eussen | |
| 2007/0242257 A1 | 10/2007 | Wurm et al. | |
| 2009/0027644 A1 | 1/2009 | Zellner et al. | |
| 2009/0153819 A1 | 6/2009 | Okita | |
| 2010/0301457 A1 * | 12/2010 | Schroeder | G03F 1/14 |
| | | | 257/618 |
| 2011/0065027 A1 | 3/2011 | Inanami et al. | |
| 2011/0122384 A1 | 5/2011 | Mann | |
| 2011/0165522 A1 | 7/2011 | Mann et al. | |
| 2012/0299159 A1 * | 11/2012 | Chen | G03F 7/70625 |
| | | | 257/620 |
| 2014/0178803 A1 * | 6/2014 | Yoo | G03F 7/20 |
| | | | 430/5 |
| 2017/0123323 A1 * | 5/2017 | Prosyentsov | G03F 7/705 |

FOREIGN PATENT DOCUMENTS

| | | |
|---|---|---|
| JP | 2001-297976 A | 10/2001 |
| JP | 2006-060154 A | 3/2006 |
| JP | 2006-179927 A | 7/2006 |
| JP | 2011-066079 A | 3/2011 |
| JP | 2012-502490 A | 1/2012 |
| WO | WO 00/067302 A1 | 11/2000 |
| WO | WO 2007/02930 A1 | 3/2007 |
| WO | WO 2007/029303 A1 | 3/2007 |

OTHER PUBLICATIONS

International Preliminary Report on Patentability and Written Opinion of the International Searching Authority directed to related International Patent Application No. PCT/EP2013/069262, dated Mar. 24, 2015; 15 pages.

Research Disclosure No. 566004, published 2011.

English-Language Abstract for Patent Publication No. WO 2007029303A1, published Mar. 15, 2007, 1 page.

* cited by examiner

LITHOGRAPHIC METHOD AND APPARATUS

CROSS-REFERENCE TO RELATED APPLICATIONS

This application claims the benefit of U.S. provisional application 61/704,144 which was filed on 21 Sep. 2012 and of U.S. provisional application 61/760,432 which was filed on 4 Feb. 2013, and which are incorporated herein in its entirety by reference.

FIELD

The present invention relates to a lithographic method and apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

SUMMARY

It may be desirable to provide an EUV lithographic apparatus which is capable of projecting a pattern with a critical dimension which is smaller than the critical dimension which is achievable using a conventional EUV lithographic apparatus.

According to a first aspect of the invention there is provided a method of exposing a patterned area on a substrate using an EUV lithographic apparatus having a demagnification of at least around 5× and a numerical aperture of at least around 0.4, the method comprising exposing a first portion of the patterned area on the substrate using a first exposure, the first portion having dimensions which are significantly less than the dimensions of a conventional exposure, and exposing one or more additional portions of the patterned area on the substrate using one or more additional exposures, the one or more additional portions having dimensions which are significantly less than the dimensions of a conventional exposure, the method further comprising repeating the above to expose a second patterned area on the substrate, the second patterned area being provided with the same pattern as the first patterned area, wherein a distance between a centre point of the first patterned area and a centre point of the second patterned area corresponds with a dimension of a conventional exposure.

The distance between the centre points of the first and second patterned areas may be around 26 mm or around 33 mm.

The dimensions of the first patterned area may correspond with dimensions of a conventional exposure.

The first patterned area may measure around 26 mm by around 33 mm.

Each patterned area may comprise a plurality of dies.

Each exposure may comprise a plurality of dies.

The first portion and the one or more additional portions may be exposed using the same mask.

The mask may be a 6 inch mask.

Each patterned area may be formed by exposing the first portion and one additional portion.

Each patterned area may be formed by exposing the first portion and three additional portions.

The exposures may be scanning exposures.

Each portion exposed on the substrate may measure less than around 17 mm in a direction which is transverse to the scanning direction.

The first portion and the one or more additional portions may comprise different portions of a die, the one or more additional pattern portions including features which connect with features of the first pattern portion.

The first pattern portion and a second pattern portion may be exposed using the same mask, the method further comprising moving the mask after exposure of the first pattern portion on the substrate to allow exposure of the second pattern portion on the substrate, or vice versa.

Movement of the mask to allow exposure of the second pattern portion after exposure of the first pattern portion may take place after multiple exposures of the first pattern portion on the substrate, or vice versa.

The mask may be a 450 mm semiconductor wafer.

The patterns may each have an aspect ratio which is greater than 2:1.

The first pattern portion may be exposed using a first mask and the second pattern portion may exposed using a second mask.

The first and second masks may be 6 inch masks.

The lithographic apparatus may have a demagnification of at least around 8×.

The lithographic apparatus may have a numerical aperture of at least around 0.6.

The lithographic apparatus may be configured to expose a first portion which measures around 17 mm by around 26 mm.

The lithographic apparatus may be configured to expose a first portion which measures around 17 mm by around 13 mm.

According to a second aspect of the invention there is provided a lithographic apparatus configured to perform the method of the first aspect of the invention.

According to a third aspect of the invention there is provided an EUV lithographic apparatus comprising a support structure constructed to support a patterning device capable of imparting an EUV radiation beam with a pattern in its cross-section to form a patterned radiation beam, a substrate table constructed to hold a substrate, and a projection system configured to project the patterned radiation beam onto a target portion of the substrate, wherein the projection system has a demagnification of at least around 5× and a numerical aperture of at least around 0.4, and wherein the EUV lithographic apparatus further comprises a control system which is configured to move the support structure and the substrate table such that a first portion of the patterned area is exposed on the substrate using a first exposure, the first portion having dimensions which are significantly less than the dimensions of a conventional exposure, and one or more additional portions of the patterned area are exposed the substrate using one or more additional exposures, the one or more additional portions having dimensions which are significantly less than the dimensions of a conventional exposure, the above is repeated to expose a second patterned area on the substrate, the second patterned area being provided with the same pattern as the first patterned area, wherein a distance between a centre point of the first patterned area and a centre point of the second patterned area corresponds with a dimension of a conventional exposure.

According to a fourth aspect of the invention there is provided a method of exposing a patterned area on a substrate using an EUV lithographic apparatus having a demagnification of at least around 5× and a numerical aperture of at least around 0.4, the method comprising exposing a first portion of the patterned area on the substrate using a first exposure, the first portion having dimensions which are significantly less than the dimensions of a conventional exposure, and exposing one or more additional portions of the patterned area on the substrate using one or more additional exposures, the one or more additional portions having dimensions which are significantly less than the dimensions of a conventional exposure, wherein the dimensions of the patterned area formed by the exposed first portion and the one or more additional exposed portions correspond with the dimensions of a conventional exposure.

According to a fifth aspect of the invention there is provided a lithographic apparatus configured to perform the method of the fourth aspect of the invention.

According to a sixth aspect of the invention there is provided an EUV lithographic apparatus comprising a support structure constructed to support a patterning device capable of imparting an EUV radiation beam with a pattern in its cross-section to form a patterned radiation beam, a substrate table constructed to hold a substrate, and a projection system configured to project the patterned radiation beam onto a target portion of the substrate, wherein the projection system has a demagnification of at least around 5× and a numerical aperture of at least around 0.4, and wherein the EUV lithographic apparatus further comprises a control system which is configured to move the support structure and the substrate table such that, a first portion of the patterned area is exposed on the substrate using a first exposure, the first portion having dimensions which are significantly less than the dimensions of a conventional exposure, and one or more additional portions of the patterned area are exposed on the substrate using one or more additional exposures, the one or more additional portions having dimensions which are significantly less than the dimensions of a conventional exposure, wherein the dimensions of the patterned area formed by the exposed first portion and the one or more additional exposed portions correspond with the dimensions of a conventional exposure.

The patterned area may measure around 26 mm by around 33 mm.

According to seventh aspect of the invention there is provided a method of exposing a pattern on a substrate using an EUV lithographic apparatus having a demagnification of at least around 5× and a numerical aperture of at least around 0.4, the method comprising exposing a first portion of the pattern on the substrate using a first scanning exposure, and exposing a second portion of the pattern on the substrate using a second scanning exposure, wherein the second portion of the pattern includes features which connect with features of the first portion of the pattern.

According to an eighth aspect of the invention there is provided an EUV lithographic apparatus comprising a support structure constructed to support a patterning device capable of imparting an EUV radiation beam with a pattern in its cross-section to form a patterned radiation beam, a substrate table constructed to hold a substrate, and a projection system configured to project the patterned radiation beam onto a target portion of the substrate, wherein the projection system has a demagnification of at least around 5× and a numerical aperture of at least around 0.4, and wherein the EUV lithographic apparatus further comprises a control system which is configured to move the support structure and the substrate table such that a first pattern portion is projected onto the substrate by a first scanning exposure and a second pattern portion is projected onto the substrate by a second scanning exposure, the second pattern portion adjoining the first pattern portion and thereby forming a combined pattern.

The control system may be configured to move the support structure in a direction transverse to the scanning direction after the first scanning exposure, thereby positioning the patterning device to allow the second scanning exposure to be performed.

The support structure may be configured to support a single mask.

The support structure may be configured to support a mask which measures around 450 mm across.

The support structure may be configured to simultaneously support a plurality of masks.

The support structure may be configured to support masks which measure 6 inches across.

The support structure may be provided with an active cooling system.

The support structure may be provided with a plurality of actuators at a mask receiving surface, each actuator being configured, in use, to move a portion of the mask in a direction which is substantially perpendicular to a patterned surface of the mask.

The projection system may have a demagnification of around 8× or more.

The projection system may have a numerical aperture of around 0.6 or more.

According to a ninth aspect of the invention there is provided an EUV lithographic apparatus comprising a support structure constructed to support a patterning device capable of imparting an EUV radiation beam with a pattern in its cross-section to form a patterned radiation beam, a substrate table constructed to hold a substrate, and a projection system configured to project the patterned radiation beam onto a target portion of the substrate, wherein the projection system has a demagnification of at least around 5× and a numerical aperture of at least around 0.4, and wherein the support structure is provided with an active cooling apparatus.

According to a tenth aspect of the invention there is provided an EUV lithographic apparatus comprising a support structure constructed to support a patterning device capable of imparting an EUV radiation beam with a pattern in its cross-section to form a patterned radiation beam, a substrate table constructed to hold a substrate, and a projection system configured to project the patterned radiation beam onto a target portion of the substrate, wherein the projection system has a demagnification of at least around 5× and a numerical aperture of at least around 0.4, and wherein the support structure includes a plurality of actuators at a mask receiving surface, each actuator being configured, in use, to move a portion of the mask in a direction which is substantially perpendicular to a patterned surface of the mask.

According to an eleventh aspect of the invention there is provided an EUV lithographic apparatus comprising a support structure constructed to support a patterning device capable of imparting an EUV radiation beam with a pattern in its cross-section to form a patterned radiation beam, a substrate table constructed to hold a substrate, and a projection system configured to project the patterned radiation beam onto a target portion of the substrate, wherein the projection system has a demagnification of at least around 5× and a numerical aperture of at least around 0.4, and wherein the support structure is configured to support a mask which measures around 450 mm across.

According to a twelfth aspect of the invention there is provided a lithographic mask comprising a substrate upon which patterns comprising EUV radiation absorbing and EUV radiation reflecting features are provided, wherein a first pattern and a second pattern are provided on the lithographic mask, the second pattern being different from the first pattern and being spaced apart from the first pattern, an edge of the second pattern including features which are arranged to connect with features at an edge of the first pattern.

The substrate may measure 300 mm or more across.

The substrate may be a wafer.

The wafer may have a diameter of around 450 mm.

The first and second patterns may be spaced apart from each other in a direction which is transverse to a direction in which scanning exposure will take place during use.

The first and second patterns may have an aspect ratio which is greater than 2:1.

The first and second patterns may each have a width of 100 mm or more.

According to a thirteenth aspect of the invention there is provided an integrated circuit comprising a first layer having a pattern which has been formed using two or more pattern portions projected by an EUV lithographic apparatus, and including subsequent layers each of which comprises a pattern which has been projected as a single exposure by a conventional lithographic apparatus.

The integrated circuit may measure around 26 mm by around 33 mm.

According to a fourteenth aspect of the invention there is provided an EUV lithographic apparatus comprising a support structure constructed to support a patterning device capable of imparting an EUV radiation beam with a pattern in its cross-section to form a patterned radiation beam, a substrate table constructed to hold a substrate, and a projection system configured to project the patterned radiation beam onto a target portion of the substrate, wherein the projection system has a demagnification of at least around 5× and a numerical aperture of at least around 0.4, and wherein the lithographic apparatus is configured such that it has a maximum exposure field which corresponds with a fraction of a conventional exposure field.

The maximum exposure field may be a half of the conventional exposure field or a quarter of the conventional exposure field. The maximum exposure field may be a third, a sixth or an eighth of the conventional exposure field, or may be some other fraction of the conventional exposure field.

The conventional exposure field may measure around 26 mm by around 33 mm.

According to a fifteenth aspect of the invention there is provided a mask provided with a pattern for patterning EUV radiation, the mask having a diameter of around 300 mm.

The mask may be generally circular.

The mask may have a thickness of around 900 microns or less.

The pattern provided on the mask may measure around 200 mm by around 150 mm.

The mask may be formed from silicon. The mask may be formed from a silicon wafer.

According to a sixteenth aspect of the invention there is provided an EUV lithographic apparatus comprising a support structure constructed to support a mask having a diameter of around 300 mm.

The support structure may be a wafer table constructed to hold a 300 mm wafer.

Features of any of the embodiments of the invention may be combined with suitable features of other embodiments of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
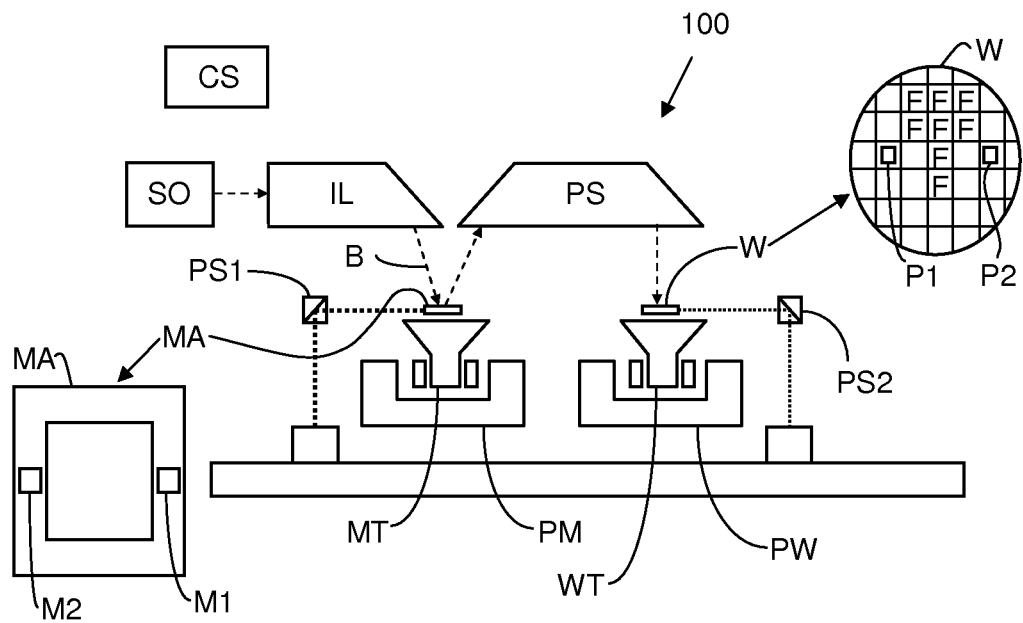
FIG. 1 depicts a lithographic apparatus according to an embodiment of the invention.

FIG. 1 schematically depicts a lithographic apparatus 100 including a source collector apparatus SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion F (e.g. comprising one or more dies) of the substrate W. The target portions F may be referred to as exposure fields.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a CO2 laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion F of the substrate W. The target portion F may be referred to as an exposure field. With the aid of the second positioner PW and position sensor PS2 (e.g. an interferometric device, linear encoder or capacitive sensor), the substrate table WT can be moved accurately, e.g. so as to position different target portions F in the path of the radiation beam B. Similarly, the first positioner PM and another position sensor PSI can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

Operation of the lithographic apparatus may be controlled by a control system CS. The control system CS may for example comprise a microprocessor or some other processing device. The control system CS may be configured to control positioning of the patterning device MA and the substrate table WT. The control system CS may do this by controlling operation of the first positioner PM and the second positioner PW.

The depicted apparatus may for example be used in scan mode, wherein the support structure (e.g. mask table) MT and the substrate table WT are scanned synchronously while a pattern imparted to the radiation beam is projected onto a substrate W (i.e. a dynamic exposure). The velocity and direction of the substrate table WT relative to the support structure (e.g. mask table) MT may be determined by the demagnification and image reversal characteristics of the projection system PS. The patterned radiation beam 26 which is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

Combinations and/or variations on the above described modes of use or entirely different modes of use may also be employed.

Figure 2:
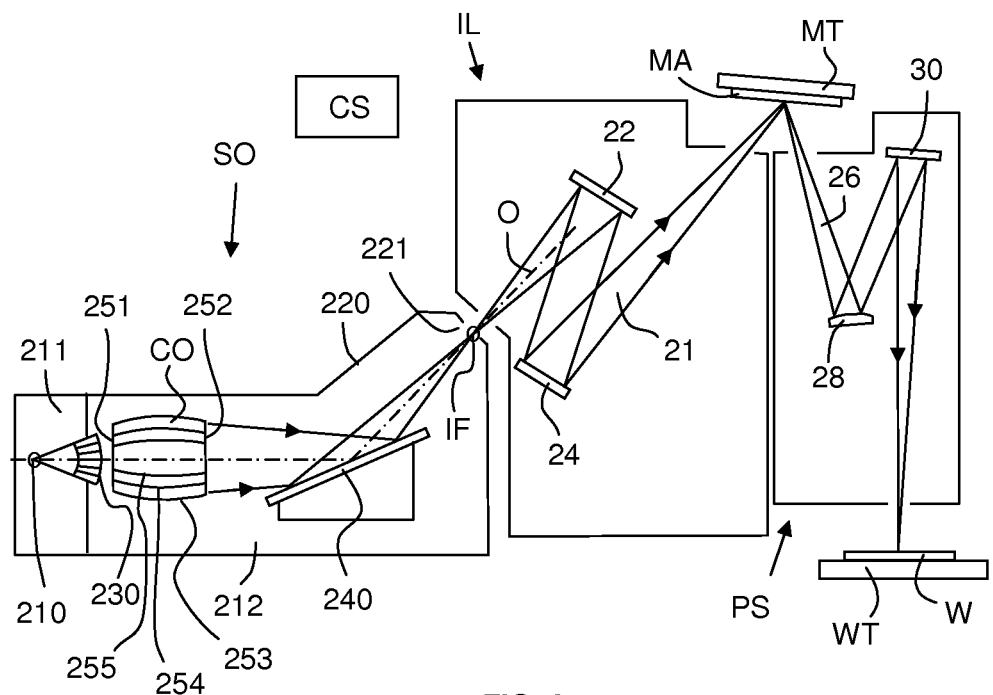
FIG. 2 is a more detailed view of the lithographic apparatus 100.

FIG. 2 shows the lithographic apparatus 100 in more detail, including the source collector apparatus SO, the illumination system IL, the projection system PS, and the control system CS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
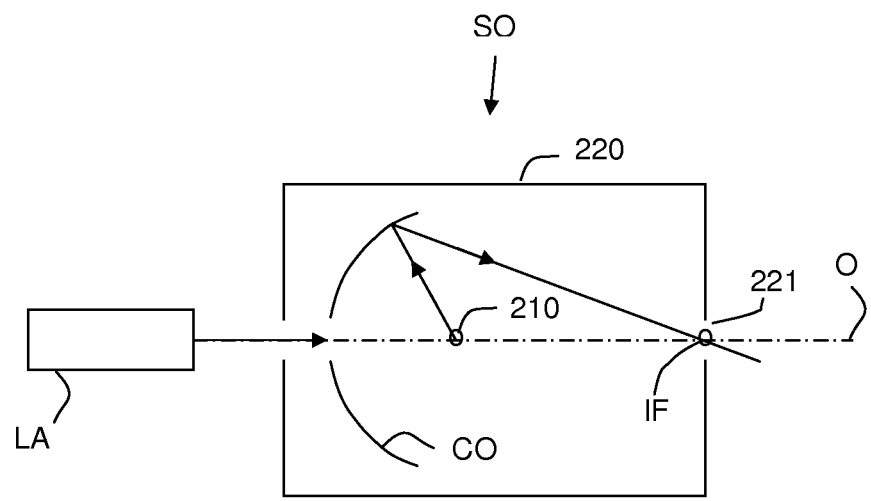
FIG. 3 is a more detailed view of the source collector apparatus SO of the apparatus of FIGS. 1 and 2.

Alternatively, the source collector apparatus SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

In an embodiment of the invention, the projection system PS of the EUV lithographic apparatus is provided with a demagnification of at least around 5×. The demagnification may for example be around 6×, may for example be around 8× or may be some other value. The term "at least around 5×" may be interpreted as encompassing demagnifications of 4.5× or greater. It may be interpreted as encompassing demagnifications of 4.9× or greater. Projection system configurations capable of providing demagnifications greater than 4× are described in U.S. Pat. No. 6,556,648, which is herein incorporated by reference. In this document, image reversal is not taken into account when referring to demagnification, and demagnification values are thus expressed as magnitude values.

Increasing the demagnification of a projection system is advantageous because it allows the numerical aperture (NA) on the substrate side of the projection system PS to be increased without increasing the numerical aperture on the mask side of the projection system. In this context the term "substrate side of the projection system" is intended to mean the portion of the projection system which is closest to the substrate table WT (this may also be referred to as the exit of the projection system). The term "mask side of the projection system" is intended to mean the portion of the projection system which is closest to the support structure MT (this may also be referred to as the entrance of the projection system).

As will be appreciated from for example FIG. 2, the beam of radiation 21 is not perpendicularly incident upon the mask MA but instead is incident upon the mask at an angle. The angle subtended by the beam of radiation relative to a perpendicular which extends from the mask MA may be referred to as the chief ray angle. The chief ray angle may be selected such that, taking into account the numerical aperture of the projection system PS at the entrance of the projection system, the capture angle of radiation captured by the projection system does not overlap with a perpendicular which extends from the mask. Because the capture angle of the projection system PS increases as the numerical aperture of the projection system increases, this means that an increase of the numerical aperture on the entrance side of the projection system must be accompanied by an increase of the chief ray angle of the radiation beam.

Figure 4:
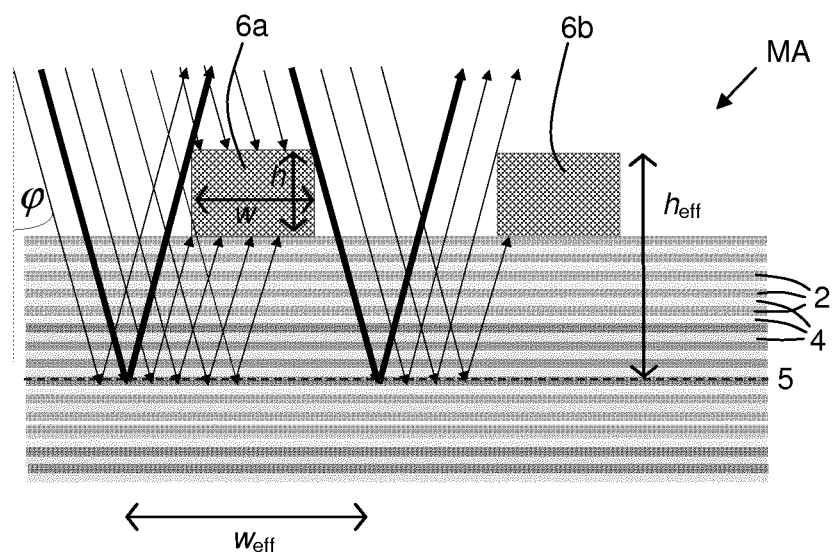
FIG. 4 schematically illustrates interaction of EUV radiation with a reflective mask.

A problem which arises if the chief ray angle is increased is represented schematically in FIG. 4. FIG. 4 shows in cross-section part of a mask MA. The mask comprises an alternating series of layers 2, 4 of material with different refractive indices. The thicknesses and refractive indices of the layers of material 2, 4 are such that the materials act as a multilayer mirror structure. EUV radiation which is incident on the mask MA is reflected by the multilayer mirror structure as represented schematically by a series of rays in FIG. 4. The chief ray angle φ of the rays of EUV radiation shown is indicated. The effective plane of reflection of the EUV radiation is located within the multilayer stack (e.g. after around 16 layers in the illustration), the effective plane of reflection being illustrated by a dotted line 5.

A pattern is formed on the mask MA by providing EUV-absorbing material on the upper surface of the multi-layer mirror structure. In FIG. 4 this is schematically represented by two blocks 6a, 6b. The blocks 6a, 6b have a width w and have a height h. If EUV radiation were to be perpendicularly incident upon the mask MA then the height h of the blocks of EUV-absorbing material 6a, 6b would have no effect upon the radiation reflected from the mask MA. Radiation incident upon the multilayer mirror structure would be reflected and radiation incident upon the upper surface of the absorbing blocks 6a, 6b would not be reflected. However, because the EUV radiation is incident upon the mask MA at an angle, some EUV radiation reflected by the multilayer structure is blocked by sides of the absorbing blocks 6a, 6b. This will increase the effective width of the blocks 6a, 6b as far as their effect on the EUV radiation is concerned. In addition, because the EUV radiation is not reflected from the surface of the multilayer structure but is instead effectively reflected from within the multilayer structure, some EUV radiation which has been reflected by the multilayer structure will be blocked by the lower surface of the blocks of absorbing material 6a, 6b. This is shown schematically in FIG. 4. Again, this increases the effective width of the blocks of radiation absorbing material 6. The thick rays in FIG. 4 indicate EUV radiation which is not blocked by the first block of radiation-absorbing material 6a. As may be seen, the separation between the rays on reflection from the mask MA is considerably greater than the width of the block 6a. The block 6a thus has an effective width weff which is considerably greater than the width w of the block. Similarly, the block 6a has an effective height heff which is considerably greater than the height h of the block.

As will be understood from FIG. 4, increasing the chief ray angle φ of incident EUV radiation will increase the effective width weff of absorbing blocks 6a, 6b on the mask MA. This may be undesirable because it may have a negative effective upon the achievable critical dimension (CD) of an image projected by the projection system PS and/or may cause other unwanted modifications of the projected image. However, as explained above, an increase of the chief ray angle may be required if the numerical aperture at the entrance to the projection system is to be increased.

Increasing the demagnification provided by the projection system PS allows a reduction of the achievable critical dimension (CD) to be obtained without increasing the numerical aperture at the entrance of the projection system PS, thereby avoiding the above problems. Increasing the demagnification provided by the projection system PS increases the numerical aperture at the exit of the projection system without increasing the numerical aperture at the entrance of the projection system. Increasing the demagnification also reduces the size of an image projected by the projection system. The demagnification may for example be increased from 4× (the conventional value) to at least around 5×.

In an embodiment, the lithographic apparatus may be configured to support masks which measure 6 inches by 6 inches (these may be referred to as 6 inch masks). This is the conventional mask size, and considerable infrastructure exists which is set up to manufacture and use masks of this size. Thus, it may be advantageous for the lithographic apparatus to be capable of using 6 inch masks.

If a 6 inch mask is used and the demagnification of the projection system PS is around 5× or more (instead of the conventional 4× demagnification) then the field which is projected onto a substrate (e.g. a wafer) during an exposure will be reduced accordingly. The exposure field which is achieved by a conventional EUV lithographic apparatus using a 6 inch mask measures 33 mm×26 mm. This conventional exposure field A is shown schematically in FIG. 5a. A double-headed arrow indicates the direction of scanning exposure, i.e. the direction in which an exposure slit 10a of the lithographic apparatus moves relative to the substrate during exposure (the movement typically arises from scanning movement of the substrate table WT, with the exposure slit being stationary). This is conventionally referred to as the y-direction (Cartesian coordinates are indicated in FIG. 5 for ease of reference). Since movement between the substrate and the exposure slit may be in the positive or negative y-direction, the arrow is double-headed in FIG. 5a. The size of the exposure slit 10a and the length of the scanning movement of the substrate is such that the entire exposure field A is exposed by a single scanning exposure. Although the exposure slit 10a is represented as a rectangle, the exposure slit may be curved.

Figure 5A:
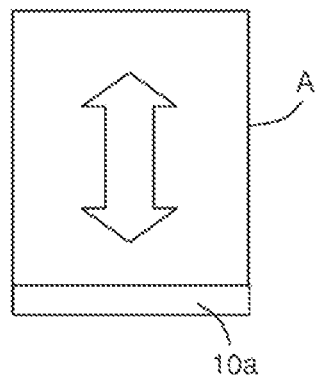
FIGS. 5A-D schematically illustrate exposure fields, which may be exposed by embodiments of the invention.
Figure 5B:
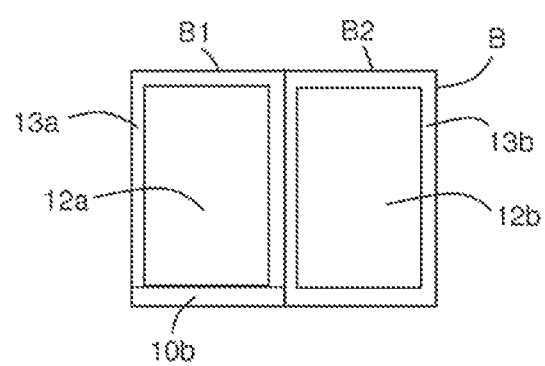

FIG. 5b illustrates a substrate exposure method according to an embodiment of the invention. The exposure method may be used for example by an EUV lithographic apparatus with a projection system PS that has a 5× demagnification. The projection system PS may for example have an exit side numerical aperture of around 0.45. As explained above, a demagnification of 5× is such that the conventional exposure field (33 mm by 26 mm) cannot be exposed in a single exposure using a 6 inch mask. Instead, two exposure fields B1, B2 are exposed, thereby exposing a patterned area B which corresponds to the conventional exposure field (this may be referred to as a combined exposure field). The exposure fields B1, B2 each measure around 26 mm by around 17 mm (e.g. around 16.5 mm), such that the two exposure fields together form a combined patterned area B which measures around 26 mm by around 33 mm.

The first exposure field B1 may be considered to be a first portion of the patterned area B, and the second exposure field B2 may be considered to be a second portion of the patterned area B. In FIG. 5b the first portion B1 of the patterned area comprises a die 12a surrounded by scribe lanes 13a. Patterns such as alignment marks or other features may be provided in the scribe lanes 13a. The scribe lanes 13a may be considered to form part of the first portion of the patterned area (and may be considered to form part of the first exposure field B1). Similarly, the second portion B2 of the patterned area comprises a die 12b surrounded by scribe lanes 13b. Patterns such as alignment marks or other features may be provided in the scribe lanes 13b. The scribe lanes 13b may be considered to form part of the second portion of the patterned area (and may be considered for form part of the second exposure field B2).

The dies 12a, 12b may be the same as each other. Similarly, the scribe lanes 13a, 13b may be the same as each other. Thus, in an embodiment, the same mask may be used to expose the first portion B1 of the patterned area B and the second portion B2 of the patterned area. The mask may for example be a 6 inch mask.

An exposure slit 10b is also shown schematically in FIG. 5b. Although the exposure slit 10b is represented as a rectangle, the exposure slit may be curved. As may be seen from FIG. 5b, the exposure fields B1, B2 are oriented such that the scanning direction (the y-direction) corresponds with longer sides of the exposure fields B1, B2. The exposure direction is transverse to the longer side of the combined patterned area B (which may be referred to as the combined exposure field).

The first portion B1 of the patterned area B may be exposed using a scanning exposure in which the substrate moves in the y direction, and the second portion B2 of the patterned area may be exposed using a scanning exposure in which the substrate moves in the −y direction (or vice versa).

It is usual in device fabrication to provide a first functional layer of an integrated circuit or other device with a small critical dimension, and to provide subsequent layers of the device with larger critical dimensions. Other lithographic apparatus, such as non-EUV lithographic apparatus, may be used to project these subsequent layers. These other lithographic apparatus may have an exposure field size of 33 mm by 26 mm. Therefore, although two exposures are required in order to form the patterned area B of FIG. 5b using the EUV lithographic apparatus, a subsequent exposure of the patterned area may be performed using a conventional single exposure and using a conventional (e.g. DUV) lithographic apparatus. The conventional single exposure may use a mask upon which two dies are provided, the dies being separated according to the arrangement shown in FIG. 5b.

Adjacent combined patterned areas B may meet along their edges (see target portions F of substrate W in FIG. 1). It follows that the separation between a centre point of a first patterned area and a centre point of a second adjacent patterned area will be 33 mm in one direction and 26 mm in the other direction. This is advantageous because it may allow a conventional (e.g. DUV) lithographic apparatus to conveniently be used when exposing subsequent layers of the device, e.g. if the conventional lithographic apparatus is configured to move the substrate by 26 mm in a direction transverse to a scanning direction after each scanning exposure of the substrate. Thus, a conventional lithographic apparatus may be used to project exposures on top of the patterned areas B formed using the EUV lithographic apparatus without changing the 'setup' of the lithographic apparatus (i.e. the distances that the substrate is moved between scanning exposures).

Although the dimensions 26 mm×33 mm are referred to above, a conventional exposure may have dimensions which differ from this. The dimensions 25 mm×33 mm are merely example dimensions.

Figure 5C:
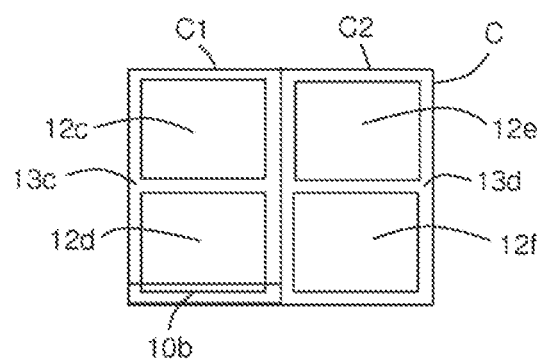

In an embodiment, shown in FIG. 5c, two exposure fields C1, C2 are exposed, thereby exposing a patterned area C which corresponds to the conventional exposure field. The exposure fields C1, C2 each measure around 26 mm by around 17 mm (e.g. around 16.5 mm), such that the two exposure fields together form a combined patterned area C which measures around 26 mm by around 33 mm.

The first exposure field C1 may be considered to be a first portion of the patterned area C, and the second exposure field C2 may be considered to be a second portion of the patterned area C. In FIG. 5c the first portion C1 of the patterned area comprises two dies 12c,d surrounded by scribe lanes 13c. Patterns such as alignment marks or other features may be provided in the scribe lanes 13c. The scribe lanes 13c may be considered to form part of the first portion C1 of the patterned area C (and may be considered to form part of the first exposure field C1). Similarly, the second portion C2 of the patterned area comprises two dies 12e,f surrounded by scribe lane 13d. Patterns such as alignment marks or other features may be provided in the scribe lanes 13d. The scribe lanes 13d may be considered to form part of the second portion C2 of the patterned area C (and may be considered to form part of the second exposure field C2).

The dies 12c-f may all be the same as each other. Similarly, the scribe lanes 13c, 13d may be the same as each other. In an embodiment, the same mask may be used to expose the first portion C1 of the patterned area C and the second portion C2 of the patterned area. The mask may for example be a 6 inch mask.

The dies 12c and 12d may be different from each other, and the dies 12e and 12f may be different from each other. However, if the dies 12c and 12e are the same as each other and the dies 12d and 12f are the same as each other, then the same mask may be used to expose the first portion C1 of the patterned area C and the second portion C2 of the patterned area. The mask may for example be a 6 inch mask.

An exposure slit 10b is also shown schematically in FIG. 5b. The scanning direction (the y-direction) corresponds with longer sides of the exposure fields C1, C2. The exposure direction is transverse to the longer side of the combined patterned area C.

The first portion C1 of the patterned area C may be exposed using a scanning exposure in which the substrate moves in the y direction, and the second portion C2 of the patterned area may be exposed using a scanning exposure in which the substrate moves in the −y direction (or vice versa).

Although two exposures are required in order to form the patterned area C of FIG. 5c using the EUV lithographic apparatus, a subsequent exposure of the patterned area may be performed using a conventional single exposure and using a conventional (e.g. DUV) lithographic apparatus. The conventional single exposure may use a mask upon which four dies are provided, the dies being separated according to the arrangement shown in FIG. 5c.

In common with the embodiment shown in FIG. 5b, the separation between a centre point of a first patterned area C and a centre point of a second adjacent patterned area will be 33 mm in one direction and 26 mm in the other direction. This is advantageous because it may allow a conventional (e.g. DUV) lithographic apparatus to conveniently be used when exposing subsequent layers of the device.

Figure 5D:
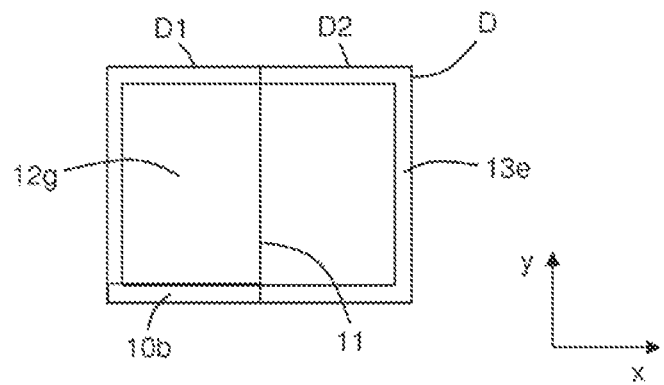

In an embodiment, shown in FIG. 5d, two exposure fields D1, D2 are exposed, thereby exposing a patterned area D which corresponds to the conventional exposure field. The exposure fields D1, D2 each measure around 26 mm by around 17 mm (e.g. around 16.5 mm), such that the two exposure fields together form a combined patterned area D which measures around 26 mm by around 33 mm. In this embodiment, the combined patterned area D is a single die 12g which is surrounded by scribe lanes 13e.

The first exposure field D1 may be exposed using a first mask (e.g. a 6 inch mask), and the second exposure field D2 may be exposed using a second mask (e.g. a 6 inch mask). The first mask may be provided with a first portion of the pattern to be exposed (i.e. half of the die 12g), and the second mask may be provided with a second portion of the pattern to be exposed (i.e. the second half of the die 12g). The first and second pattern portions thus combine on the substrate to form a single die 12g. The first and second portions of the pattern may include features which connect with one another, e.g. along an edge where images of the first and second patterns adjoin one another.

The features which connect with one another may have a critical dimension which is greater than the critical dimension of features in other parts of the patterns. These features with greater critical dimensions may provide an increased tolerance to errors or other effects which may occur at the join between the exposed patterns. This may reduce the likelihood of an unsuccessful fusion between the exposed patterns which could cause an integrated circuit or other device to not operate correctly.

Stitching of patterns may be used at a border 11 between the exposed fields. Stitching is well-known in the art and is thus not described in detail here.

Figure 6A:
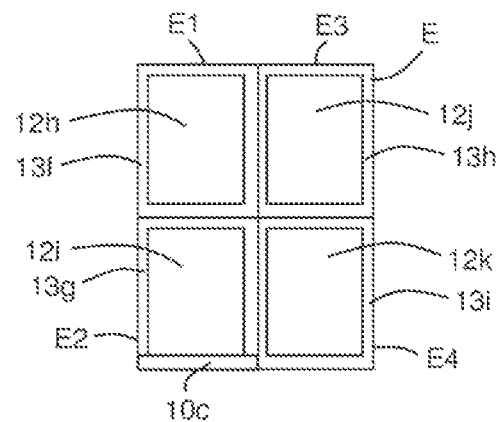
FIGS. 6A-B also schematically illustrate exposure fields, which may be exposed by embodiments of the invention.

FIG. 6a shows an alternative embodiment of the invention in which a patterned area E is exposed using four exposures E1-E4. This approach may be used for example in an EUV lithographic apparatus with a projection system PS that has a demagnification of around 8×. The projection system PS may for example have an exit side numerical aperture of around 0.6. Each exposure field E1-E4 measures around 17 mm (e.g. around 16.5 mm) by around 13 mm, such that the four exposure fields together form a combined patterned area E which measures around 26 mm by around 33 mm. The combined patterned area E may also be referred to as a combined exposure field.

The first exposure field E1 may be considered to be a first portion of the patterned area E, and the second exposure field E2 may be considered to be a second portion of the patterned area E, etc. In FIG. 6a the first portion E1 of the patterned area comprises a die 12h surrounded by scribe lanes 13f. Patterns such as alignment marks or other features may be provided in the scribe lanes 13f. The scribe lanes 13f may be considered to form part of the first portion of the patterned area (and may be considered to form part of the first exposure field E1). The same applies to portions E2-E4 of the patterned area E, each portion comprising a die 12i-k surrounded by scribe lanes 13g-i.

The dies 12h-k may be the same as each other. Similarly, the scribe lanes 13f-i may be the same as each other. Thus, in an embodiment, the same mask may be used to expose each portion E1-E4 of the patterned area E. The mask may for example be a 6 inch mask.

An exposure slit 10c is also shown schematically in FIG. 6a. Although the exposure slit 10c is represented as a rectangle, the exposure slit may be curved. As may be seen from FIG. 6a, the exposure fields E1-E4 are oriented such that the scanning direction (the y-direction) corresponds with longer sides of the exposure fields. The exposure direction is parallel to the longer side of the combined patterned area E (which may be referred to as the combined exposure field).

As explained further above, other lithographic apparatus may have an exposure field size of 33 mm by 26 mm. Therefore, although four exposures are required in order to form the patterned area E of FIG. 6a using the EUV lithographic apparatus, a subsequent exposure of the patterned area may be performed using a conventional single exposure and using a conventional (e.g. DUV) lithographic apparatus. The conventional single exposure may use a mask upon which four dies are provided, the dies being separated according to the arrangement shown in FIG. 6a.

The separation between a centre point of a first patterned area and a centre point of a second adjacent patterned area will be 33 mm in one direction and 26 mm in the other direction. This is advantageous because it may allow a conventional (e.g. DUV) lithographic apparatus to conveniently be used when exposing subsequent layers of the device (as explained further above).

Figure 6B:
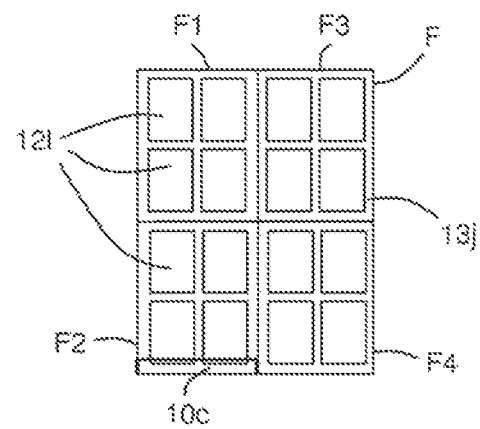

FIG. 6b shows an alternative embodiment of the invention in which a patterned area F is again exposed using four exposures F1-F4. However, in this instance, each exposure contains four dies 121. The patterned area F (which may be referred to as the combined exposure field) thus contains sixteen dies 121. Other aspects of the embodiment shown in FIG. 6b may correspond with aspects described above in relation to FIG. 6a.

In an embodiment (not illustrated), four exposures may be used to form a single die (in a manner analogous to that described above in relation to FIG. 5b).

In some instances, the dies which are being exposed may have dimensions which do not fit neatly into a patterned area which measures 33×26 mm. For example, a NAND die may have a surface area in the range 150 mm2-175 mm2 (the size of the NAND die may be determined by various parameters which are not discussed here). Where this is the case, the size of the patterned area (the combined exposure field) may be adjusted to be less than 33×26 mm (i.e. less than 858 mm2). The size of the patterned area may be selected to correspond with a multiple of the area of the die, but also taking into account the size of the exposures which are achievable using the EUV lithographic apparatus. For example, referring to FIG. 6a, if the patterned area E is split into four exposures E1-E4 then the area of each exposure may be around 214 mm2. This is not sufficiently large to accommodate two NAND dies (assuming that the NAND dies have areas in the above range), but is significantly greater than the area of a single NAND die. Therefore, in order to maximize the number of NAND dies which may be exposed on a wafer, the size of the patterned area E may be reduced. For example, the size of the patterned area E may be reduced to be around four times the size of the NAND die which is to be exposed. For example, if the NAND die has a surface area of 150 mm2 then the patterned area E may have a surface area of around 600 mm2. Similarly, if the NAND die has a surface area of 175 mm2 then the patterned area E may have a surface area of around 700 mm2. If the surface area of the NAND die is somewhere within those two values then the surface area of the patterned area E may be correspondingly within those two values. Although in this situation the patterned area E does not measure 33×26 mm, it may nevertheless be considered to have conventional exposure dimensions (a subsequent exposure of the patterned area E performed using conventional DUV lithographic apparatus may be performed as a single exposure with a conventional mask).

In an alternative example, the dies being exposed may be DRAM dies. These tend to be smaller than NAND dies, and may for example have an area of around 50 mm2, which is expected to shrink to around 30 mm2 in the next few years. Again, an approach such as that described above in relation to NAND dies may be used, fitting as many DRAM dies into the exposure field as possible.

In an embodiment, the DRAM dies may be sufficiently small that it may be possible to fit more than one DRAM die into an exposure performed by the EUV lithographic apparatus. For example, as shown in FIG. 6b, it may be possible to fit four DRAM dies into each exposure. Again, the DRAM dies which are being exposed may have dimensions which do not fit neatly into a patterned area which measures 33×26 mm. In order to maximize the number of DRAM dies which may be exposed on a wafer, the size of the patterned area F (combined exposure field) may be reduced to be around sixteen times the size of the DRAM die which is to be exposed. Although, again, in this situation the patterned area F does not measure 33×26 mm, it may nevertheless be considered to have conventional exposure dimensions (a subsequent exposure of the patterned area F performed using conventional DUV lithographic apparatus may be performed as a single exposure with a conventional mask).

In general, for a given size of die, a calculation may be performed to determine whether more than one die will fit into maximum exposure field that the EUV lithographic apparatus is capable of providing. This could for example be around 26 mm by around 17 mm (e.g. around 16.5 mm), could for example be around 13 m by around 17 mm (e.g. around 16.5 mm), or may be some other size. If more than one die will fit into the maximum exposure field, then a suitable arrangement of the dies in the exposure field is then determined. The arrangement of the dies may fit the maximum possible number of dies possible in the exposure field. The size of the exposure field may be reduced to correspond with the combined area of the dies in the exposure field. The exposure fields may then be grouped together to form a patterned area which provides the maximum number of exposure fields possible in the patterned area (the patterned area being limited in size to a conventional size such as 33×26 mm). The control system CS of the EUV lithographic apparatus may be then be used to expose exposure fields and patterned areas accordingly.

If only a single die will fit into the maximum exposure field, then the size of the exposure field may be reduced to correspond with the area of the die. The exposure fields may then be grouped together to form a patterned area which provides the maximum number of exposure fields possible in the patterned area (the patterned area being limited in size to a conventional size such as 33×26 mm). The control system CS of the EUV lithographic apparatus may be then be used to expose exposure fields and patterned areas accordingly.

In some instances it may the case that there is a poor match between the die size and the maximum exposure field size. For example, the die size may correspond with 66% of the maximum exposure field size. Where this is the case, one or more full dies may be exposed together with part of a die. The next exposure may then expose the other part of the die, together with one or more dies. For example, the first exposure may expose a full die and half of a die, and the next exposure may expose the other half of the die and expose a full die. Stitching may be used to join together the two half dies. In embodiments such as this more than one mask may be used. Alternatively, a single mask provided with different patterns may be used (e.g. an oversized mask).

Figure 6B:
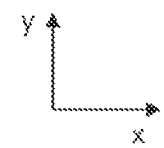

The projection system demagnifications and exit side numerical apertures referred to above in connection with FIGS. 5 and 6 are examples of demagnifications and numerical apertures which together allow a patterned area (or combined exposure field) to be formed with dimensions that correspond with an exposure field exposed by a conventional lithographic apparatus (and/or with a separation which corresponds with the separation between exposure fields of a conventional lithographic apparatus). Other combinations of demagnification and exit side numerical aperture may be used.

The dimensions 26 mm×33 mm are referred to above as being the dimensions of a conventional exposure field. As has been explained above, an EUV lithographic apparatus may be configured such that it has a maximum exposure field which corresponds with half of this conventional exposure field, or which corresponds with a quarter of this conventional exposure field (or some other fraction of the conventional exposure field such as a third, a sixth or an eighth). As has also been explained above, in some instances the exposure field which is exposed using the EUV lithographic apparatus may be smaller than a fraction of the conventional exposure field. This may be for example in order to accommodate die sizes which do not fit well within the maximum exposure field, whilst maximising the number of dies which are exposed on a wafer. Nevertheless, it may remain the case that the maximum exposure field achievable by the EUV lithographic apparatus corresponds with a fraction of the conventional exposure field. This is because the most efficient use of EUV radiation will occur when substantially all of the available EUV radiation is used to project a pattern from a mask onto a substrate. That is, when masking blades or other blocking apparatus are not used to block a significant amount of EUV radiation. Since conventional lithographic apparatus are generally configured to provide exposure fields which measure 26 mm×33 mm, the EUV lithographic apparatus may be configured such that it has a maximum exposure field which substantially corresponds to a fraction of this size. This may provide optimal potential compatibility with conventional lithographic apparatus (which are most efficient when projecting patterns which substantially fill the 26 mm×33 mm area) whilst avoiding blocking a significant amount of EUV radiation (and thereby avoiding the throughput reduction which would arise due to blocking of EUV radiation).

Referring again to FIG. 5d, in an embodiment all of the D1 exposure fields which are to be exposed using a first mask (referred to here as mask D1) may be exposed on a substrate. Following this, the mask D1 may be swapped for a second mask (referred to here as mask D2). The mask D2 may then be used to expose all of the D2 exposure fields on the substrate. Thus, only one mask exchange is required during exposure of the substrate. To avoid having to swap the masks again prior to exposure of the next substrate, the mask D2 may be used to expose fields on the next substrate. The mask D2 may then be swapped for the mask D1, following which the mask D1 may be exposed on the substrate.

In an alternative approach, the masks D1, D2 may be swapped after every exposure. This may however have a significant impact upon the throughput of the lithographic apparatus, because swapping the masks may take a significant period of time (e.g. around 30 seconds). An advantage of swapping the masks after each exposure is that the condition of resist on the substrate is less likely to have changed between exposure of the first and second masks D1, D2 (compared with the situation if all of the exposures of the D1 mask are performed before all of the exposures of the D2 mask).

In an embodiment, the support structure MT may be configured to hold both masks D1, D2. The support structure may be configured to bring the first mask D1 into alignment with the projection system PS when it is required, and then bring the second mask D2 into alignment with the projection system when it is required (e.g. by moving the masks D1, D2 in the x-direction).

The lithographic apparatus may be configured to use masks which measure 6 inches by 6 inches (the conventional mask size). The support structure MT of the lithographic apparatus may be configured to support a single 6 inch mask. It may be advantageous for the lithographic apparatus to use 6 inch masks, since the 6 inch masks may be manufactured and handled using existing apparatus. The support structure MT of the lithographic apparatus may be configured to support a single 6 inch mask, or two or more 6 inch masks.

Figure 7:
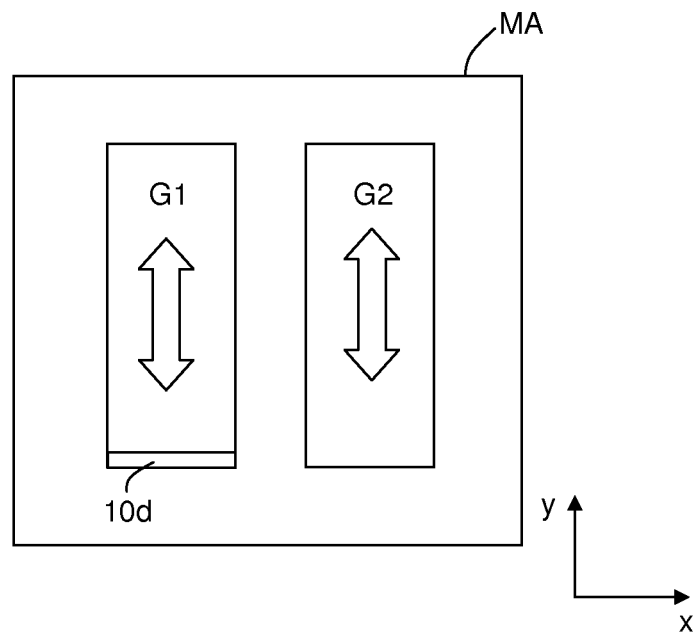
FIG. 7 schematically illustrates a mask according to an embodiment of the invention.

An alternative embodiment is illustrated schematically in FIG. 7. In FIG. 7 a mask MA is provided with two patterned regions G1, G2. The patterned regions G1, G2 each have a different pattern. The patterned regions G1, G2 are spaced apart from one another. A non-patterned region may exist between the patterned regions G1, G2. Alignment marks (not shown) may be located between the patterned regions G1, G2 (and may be located in other places on the mask MA).

The patterns of the patterned regions G1, G2 are arranged such that together they form a single pattern. That is, the first patterned region G1 has a first pattern portion, and the second patterned region G2 has a second pattern portion, the first and second pattern portions together forming a pattern. Thus, a combined exposed field having a single combined exposed pattern may be exposed on a substrate using the patterned regions G1, G2 of the mask MA. The first pattern G1 may for example be used to form an exposed field which measures around 13 mm by around 33 mm, and the second pattern G2 may similarly be used to form an exposed field measuring around 13 mm by around 33 mm. These two exposed fields may be located next to each other such that together they form a combined exposed field which measures around 26 mm by around 33 mm. Features of the two patterns G1, G2 may connect to one another at an adjoining edge of the two exposed fields.

The mask MA may for example be used in an EUV lithographic apparatus which has a demagnification of around 8x. The EUV lithographic apparatus may for example have a numerical aperture of around 0.6 (e.g. around 0.60). The first pattern G1 on the mask may for example measure around 104 mm by around 264 mm, and the second pattern G2 on the mask may similarly measure around 104 mm by around 264 mm.

Because the combined exposure field exposed using the mask MA of FIG. 7 measures around 26 mm by around 33 mm, other lithographic apparatus, such as conventional lithographic apparatus, may be used to project subsequent layers on top of the combined exposure field. These other lithographic apparatus may have an exposure field size of around 33 mm×around 26 mm. Therefore, although two exposures are required in order to form a combined exposure field using the mask MA of FIG. 7, a subsequent exposure of the exposure field may be performed using a conventional single exposure and using a conventional lithographic apparatus.

Since the same mask MA is used for both exposures there is no need for the mask to be exchanged for a different mask between exposures. Thus, the embodiment illustrated in FIG. 7 may provide a significantly higher throughput of the EUV lithographic apparatus than might otherwise be achieved. However, the embodiment shown in FIG. 7 may require a non-conventional support structure MT configured to support the mask MA, since the mask is considerably larger than a conventional mask.

The size of the exposure slit 10d of the lithographic apparatus may be substantially unchanged compared with known EUV lithographic apparatus. The patterns G1, G2 may thus each have a conventional size transverse to the scanning direction (i.e. in the x-direction in FIG. 7). However, the lengths of the patterns G1, G2 in the scanning direction (indicated as the y-direction in FIG. 7) may be significantly greater than the conventional length. This may not require any modification of the optics of the lithographic apparatus, but may require the positioner PM of the support structure MT to have a longer movement than a conventional positioner. The movement of the positioner PM is sufficient to allow a scanning exposure to expose the entire length of the pattern G1 (or G2) onto a substrate. The position of the mask MA may be controlled by the control system CS of the lithographic apparatus.

The aspect ratio of the patterns G1, G2 may differ significantly from the aspect ratio of the pattern on a conventional masks. For example, a conventional pattern on a conventional mask may have an aspect ratio of 1.27:1. The patterns G1, G2 may for example have an aspect ratio which is double this, for example around 2.5:1. The aspect ratio of the patterns G1, G2 may for example be greater than 1.5:1, and may for example be greater than 2:1.

Double headed arrows in FIG. 7 indicate the scanning direction, i.e. the direction in which scanning movement of the mask MA takes place during exposure of a substrate. The patterns G1, G2 are separated in the non-scanning direction. Thus, a movement of the mask MA transverse to the scanning direction is needed after an exposure has been performed using the first pattern G1 in order to perform an exposure using the second pattern G2. The positioner PM which moves the support structure MT (see FIG. 1) may thus be configured to provide scanning movement of the mask MA in a first direction and to also provide transverse movement of the mask. The positioner PM may for example include an extra actuator which provides the transverse movement.

In general, a mask (e.g. an oversized mask) may include two or more patterns which are separated in a non-scanning direction. A lithographic apparatus may include a positioner which is configured to move the support structure MT in the scanning direction and transverse to the non-scanning direction. This will allow different patterns to be exposed on a substrate using the mask.

In an embodiment, all exposure fields which are to receive the first pattern G1 may be exposed on a substrate, following which all exposure fields which are to receive the second pattern G2 may be exposed on the substrate. This provides the advantage that transverse movement of the mask MA occurs only once during exposure of the substrate. The impact on throughput of the lithographic apparatus may therefore be small. Where this approach is used, for the next substrate the second pattern G2 may be used to expose the substrate first, followed by the first pattern G1. Thus, transverse movement of the mask MA is not required when the exposed substrate is being exchanged for an unexposed substrate.

In an embodiment, all exposure fields which are to receive the first pattern G1 may be exposed on a substrate, following which all exposure fields which are to receive the second pattern G2 may be exposed on the substrate. Thus, transverse movement of the mask MA occurs only once during exposure of the substrate. Transverse movement of the mask MA may occur again during the period in which the exposed substrate is swapped for an unexposed substrate. If the transverse movement of the mask takes less time than the time required for the substrate swap, then the transverse movement does not cause any loss of throughput of the lithographic apparatus. An advantage of performing the transverse movement during the substrate swap is that the patterns G1, G2 are exposed on every substrate in the same order. Since resist may have time dependent behaviour, this may provide better consistency between exposed substrates than might be the case if the transverse movement were not performed during the substrate swap.

The mask MA shown in FIG. 7 is sufficiently large to accommodate the two patterns G1, G2, and is significantly larger than a conventional 6 inch mask. Masks having other sizes which are significantly larger than a conventional 6 inch mask may be used. Masks which are significantly larger than a conventional 6 inch mask may be referred to as oversized masks. An oversized mask MA may for example have a pattern arrangement as shown in FIG. 7 or may have any other pattern arrangement. An oversized mask may be made from any suitable material. The oversized mask MA may for example measure around 6 inches by around 12 inches. An oversized mask may be formed for example from ULE (Ultra Low Expansion Glass) available from Corning of New York, USA, formed from Zerodur™ available from Schott AG of Mainz, Germany, formed from quartz, from silicon, or from some other suitable semiconductor. The oversized mask MA may for example be formed from a quartz plate which measures around 6 inches by around 12 inches.

Figure 8:
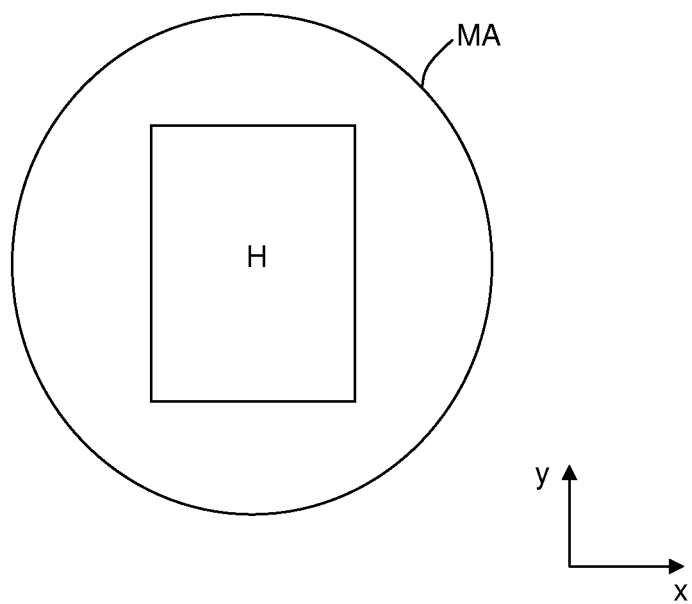
FIG. 8 schematically illustrates a mask according to an embodiment of the invention.

In an embodiment, shown schematically in FIG. 8, an oversized mask MA may be formed using a wafer. The wafer may for example be a semiconductor wafer, and may for example be a silicon wafer. The wafer may for example be substantially circular and may have a diameter of around 300 mm. Alternatively, the oversized mask MA may be formed from a material other than semiconductor, for example ULE, but may be substantially circular and may have a diameter of around 300 mm. Using a material such as ULE may provide the advantage (compared with silicon) that less expansion of the mask will occur when the mask is heated by an EUV radiation beam in use. The semiconductor or ULE (or other material) may provide a substrate upon which a multilayer stack which reflects EUV is provided. Pattern features may then be provided on the multilayer stack. A pattern H provided on the mask may have a conventional arrangement (e.g. a single rectangle with a conventional aspect ratio) or any other suitable arrangement.

An advantage of providing a mask MA with a diameter of around 300 mm is that it may be handled using apparatus which is the same as or similar to apparatus used to handle a 300 mm diameter wafer. Since 300 mm diameter wafers have been used widely in the lithography industry for may years such apparatus is widely available. In one example, a wafer table WT constructed to hold a 300 mm wafer may be used as a support structure MT (see for example FIG. 2) to hold a 300 mm diameter mask MA. Similarly, a positioner PW configured to control the position of the wafer table WT may be used to control the position of the support structure MT holding the mask MA.

Modifications may be made to apparatus as necessary to allow it to be used to handle a 300 mm diameter mask MA instead of a 300 mm diameter wafer. For example, a 300 mm diameter mask MA may be significantly thicker than a 300 mm diameter wafer, and apparatus may be modified to accommodate this increased thickness.

In an embodiment, a 300 mm diameter mask MA may have a thickness which is significantly less than the thickness of a conventional mask. A 300 mm diameter mask MA may have a thickness which is similar to or substantially equal to the thickness of a 300 mm diameter wafer. A 300 mm diameter mask MA may for example have a thickness of around 900 microns or less. A 300 mm diameter mask MA may for example have a thickness of around 600 microns or more. If the mask MA is formed using a semiconductor wafer (e.g. a silicon wafer) it may inherently have a thickness in the range 600-900 microns. If the mask MA is formed using some other material (e.g. ULE) then it may initially have a thickness which is significantly greater than 900 microns, and may be reduced to this thickness using a suitable process (e.g. a mechanical process). This thickness reduction may be performed before a pattern has been provided on the mask MA.

Providing a mask MA which has a thickness of around 900 microns or less goes against the conventional practice of providing a much thicker mask. A conventional mask for a lithographic apparatus may for example be several millimeters thick (e.g. around 6 mm), and may for example be formed from ULE or glass. It has conventionally been assumed that a thick mask is needed in order to provide sufficient mechanical strength. However, it has now been realized that a significantly thinner mask may be used in an EUV lithographic apparatus. Using a thinner mask is advantageous because it allows a cooling system to remove heat from the mask more effectively. This is particularly advantageous in an EUV lithographic apparatus with a high numerical aperture (e.g. 0.4 or more) because the intensity of EUV radiation incident upon the mask is higher than in a lower NA EUV lithographic apparatus, and the resulting heating of the mask caused by the EUV radiation is correspondingly greater. The mask may be formed from a material which is a good heat conductor in order to facilitate the transfer of heat from the mask to a cooling system. For example, the mask may be formed from silicon.

In its simplest form the mask may comprise a 300 mm diameter silicon wafer upon which a pattern is provided (e.g. using a multilayer stack).

A 300 mm diameter mask MA may for example be used instead of a mask which measures 9 inches by 9 inches (which may be referred to as a 9 inch mask), and may be provided with a pattern which has similar dimensions to a pattern which would be seen on a 9 inch mask. The pattern on the 300 mm diameter mask may for example measure around 200 mm by around 160 mm (e.g. when using a lithographic apparatus with a reduction factor of 6 to form an image which measures around 33 mm by around 26 mm).

The support structure MT (see for example FIG. 2) may be configured to provide active cooling of the 300 mm mask MA using an active cooling system. The active cooling system may use a fluid, e.g. a liquid such as water. Cooling of the 300 mm mask MA may be more effective than cooling of a conventional mask. This is because the 300 mm mask MA is significantly thinner than a conventional mask, and as a result transfer of heat from a heated surface of the mask (i.e. the surface of the mask that receives EUV radiation) to a cooled surface of the mask (i.e. the opposite surface of the mask) may take place more effectively. The thickness and material of the 300 mm mask MA may be selected to provide a desired amount of structural rigidity whilst also allowing sufficiently effective cooling of the mask to be achieved.

The mask MA may have a diameter which is slightly greater or smaller than 300 mm (e.g. by 5%), although its diameter should be such that it can be handled using apparatus configured to handle a 300 mm diameter wafer. The mask MA may thus be referred to as having a diameter of around 300 mm.

Similarly, the mask MA may have a thickness which is slightly greater or smaller than the thickness of a conventional 300 mm diameter wafer (e.g. by 10%), although its thickness should be such that it can be handled using apparatus configured to handle a conventional 300 mm diameter wafer. The mask MA may thus be referred to as having a diameter which is substantially equal to the diameter of a conventional 300 mm diameter wafer.

Although the mask MA is referred to as having a diameter of 300 mm, it need not necessarily be perfectly circular. The mask may be sufficiently close to being perfectly circular that it can be handled using apparatus configured to handle a 300 mm diameter wafer. The mask may be referred to as being generally circular (which may be interpreted as meaning sufficiently close to perfectly circular to allow handling by apparatus configured to handle a 300 mm diameter wafer). For example, the mask may be circular but with part of its perimeter having a flat edge (as is conventionally provided on some wafers).

In an embodiment, a mask may have a diameter of around 450 mm. The 450 mm mask may share one or more features such as materials, thickness, etc with the 300 mm diameter mask.

Figure 9:
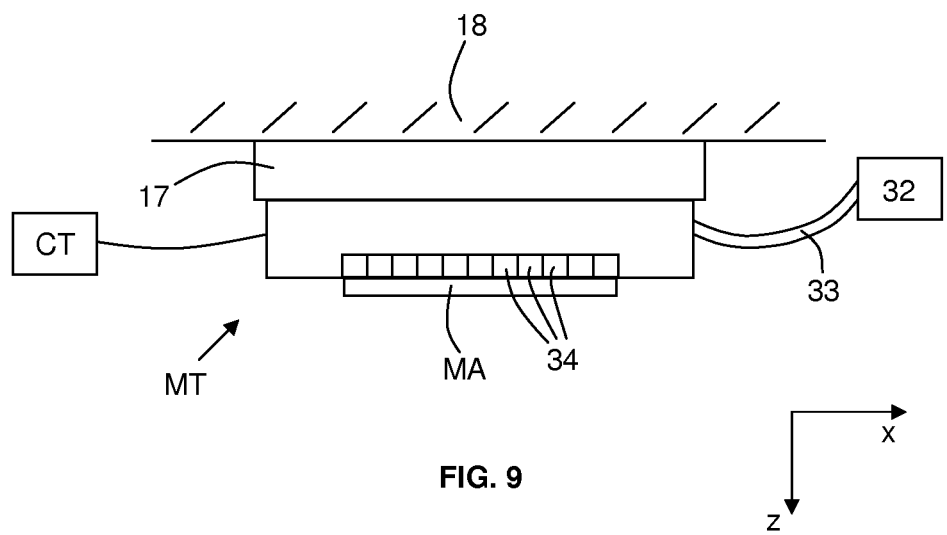
FIG. 9 schematically illustrates a support structure according to an embodiment of the invention.

An embodiment of the invention is illustrated schematically in cross-section in FIG. 9. FIG. 9 shows a support structure MT which is configured to hold an oversized mask MA. The support structure MT may for example be the support structure of the lithographic apparatus shown in FIGS. 1 and 2.

The support structure MT includes a positioner 17 which is configured to move the mask support structure relative to a frame 18 of the lithographic apparatus. The positioner 17 is configured to move the support structure MT in a direction which is transverse to the scanning exposure direction of the lithographic apparatus (i.e., to move the support structure in the x-direction in FIG. 9). The positioner 17 may be used to move the mask MA in the transverse direction after exposure of the first pattern D1 onto a substrate in order to allow the second pattern D2 to be exposed onto the substrate (see FIG. 7). The positioner 17 may similarly be used to move the mask MA in the transverse direction after exposure of the second pattern D2 onto a substrate in order to allow the first pattern D1 to be exposed onto the substrate.

The support structure MT includes an active cooling system which is configured to remove heat from the support structure, thereby providing a degree of control of the temperature of the mask MA. The active cooling system may comprise one or more channels through which a cooling fluid may circulate. The active cooling system may be provided with cooling fluid via a conduit 33 which is connected to a fluid reservoir 32. The conduit may be flexible in order to accommodate movement of the support structure MT. The cooling fluid may be a liquid or may be a gas. In an alternative arrangement (not illustrated) the active cooling system may comprise gas outlets configured to provide a flow of gas over the surface of the mask, the flow of gas acting to cool the mask.

The mask MA may be formed from silicon (or some other suitable semiconductor), e.g., in the form of a semiconductor wafer. Where this is the case, then the mask MA may have a thickness which is significantly less than the thickness of a mask formed from ULE. For example, the wafer may have a thickness of around 900 microns (or less). This may be a tenth of the thickness of a ULE mask. Active cooling of a mask formed using a wafer may be more effective than active cooling of a ULE mask, because the transfer of heat from one side to an opposite side of the mask may occur much more quickly than would be the case in a ULE mask.

In addition to moving the support structure MT transverse to the scanning exposure direction, the positioner 17 may also move the support structure in the scanning exposure direction during exposure of an exposure field. Alternatively, a different positioner may be used to move the support structure in the scanning direction.

A plurality of actuators 34 are provided on a mask receiving surface of the support structure MT. The actuators are configured to move the mask MA in the z-direction and minus z-direction in FIG. 9 (i.e. in a direction which is substantially perpendicular to a patterned surface of the mask). This movement of the mask MA may be used to compensate for z-direction expansion of the mask MA during a scanning exposure. Z-direction expansion of the mask MA may occur due to a substantial amount of heat being delivered to the mask by the EUV radiation during exposure. The mask MA may expand away from the support structure MT due to this heat. The actuators 34 may compensate for this expansion by moving in the opposite direction (e.g., drawing an inward face of the mask MA toward the support structure MT). The actuators 34 may for example be provided as an array, which may extend across the patterned regions of the mask MA.

In an embodiment, the control system CS (see FIGS. 1 and 2) may be used to control the positioner 17. The control system CS may also be used to control the actuators 34. Control of the actuators 34 may be based upon previously obtained measurements of z-direction expansion of the mask MA (i.e., feed forward correction), or may be based upon real time measurements of z-direction expansion of the mask (i.e., feed back correction) obtained using sensors (not shown).

In an alternative embodiment, positioner or actuator which moves the entire support structure MT in the z-direction may be used to compensate for (or substantially compensate for) z-direction expansion of the mask MA during a scanning exposure. The positioner or actuator may be controlled by the control system, e.g. using feed forward correction or feed back correction.

Embodiments of the invention may use a projection system having a demagnification of at least around 5×. Embodiments of the invention may use a projection system having a numerical aperture of around 0.4 or more (e.g. around 0.45 or more, around 0.50 or more, around 0.55 or more, or around 0.6 or more).

Although the dimensions 26 mm×33 mm are referred to above, a conventional exposure may have dimensions which differ from this. The dimensions 26 mm×33 mm are merely example dimensions.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

The invention claimed is:

1. A method of forming a patterned area on a substrate, the method comprising:
   performing successively a series of exposures using an EUV lithographic apparatus having a demagnification of at least 5× and a numerical aperture of at least 0.4 to form the patterned area on the substrate;
   forming a first pattern of the patterned area, wherein the forming comprises:
      scanning a first patterned region on a patterning device in a scanning direction,
      exposing a first portion of the first pattern on the substrate with the first patterned region,
      moving the patterning device in a direction transverse to the scanning direction,
      scanning a second patterned region on the patterning device in the scanning direction, and
      exposing a second portion of the first pattern on the substrate with the second patterned region, and
   forming a second pattern of the patterned area on the substrate, the second pattern being similar to the first pattern,
   wherein a distance between a center point of the first pattern and a center point of the second pattern corresponds to a dimension of an area of a pattern formed in a single exposure by a lithographic apparatus having a demagnification less than 5×.

2. The method of claim 1, further comprising using a dimension of around 26 mm or around 33 mm for the distance between the center points of the first and second patterns.

3. The method of claim 1, further comprising using an area of around 26 mm by around 33 mm for the first pattern.

4. The method of claim 1, further comprising using a plurality of dies for the first and second patterns.

5. The method of claim 1, wherein the performing successively the series of exposures comprises using a plurality of dies.

6. The method of claim 1, wherein the performing successively the series of exposures comprises using a 6 inch mask.

7. The method of claim 1, wherein the performing successively the series of exposures comprises using scanning exposures to form each pattern of the patterned area.

8. The method of claim 1, wherein the forming of the first pattern comprises exposing the first portion and the second portion to each have a dimension less than around 17 mm in a direction transverse to the scanning direction.

9. The method of claim 1, wherein:
   the forming of the first pattern comprises using different portions of a die; and
   the first and second portions of the first pattern having features that connect with each other.

10. The method of claim 1, wherein the performing successively the series of exposures comprises using the EUV lithographic apparatus having a demagnification of at least 8×.

11. The method of claim 1, wherein the performing successively the series of exposures comprises using the EUV lithographic apparatus having a numerical aperture of at least 0.6.

12. The method of claim 1, wherein exposing the first portion of the first pattern comprises exposing the first portion having an area of around 13 mm by around 33 mm.

13. The method of claim 1, wherein exposing the second portion of the first pattern comprises exposing the second portion having an area of around 13 mm by around 33 mm.

14. The method of claim 1, wherein scanning the first patterned region of the patterning device comprises scanning the first patterned region having an aspect ratio greater than 2:1, and scanning the second patterned region of the patterning device comprises scanning the second patterned region having an aspect ratio greater than 2:1.

15. An EUV lithographic apparatus configured to form a patterned area on a substrate, the EUV lithographic apparatus comprising:
   a support structure configured to support a patterning device capable of imparting an EUV radiation beam with a pattern in its cross-section to form a patterned radiation beam;
   a substrate table configured to hold the substrate;
   a projection system configured to project the patterned radiation beam onto a target portion of the substrate, wherein the projection system has a demagnification of at least 5× and a numerical aperture of at least 0.4; and
   a control system configured to move the support structure and the substrate table such that:
      a first patterned region on the patterning device is scanned in a scanning direction,
      a first portion of a first pattern of the patterned area is exposed on the substrate using the first patterned region,
      the patterning device is moved in a direction transverse to the scanning direction,
      a second patterned region on the patterning device is scanned in the scanning direction,
      a second portion of the first pattern is exposed on the substrate using the second patterned region, and
      a second pattern is exposed on the substrate, the second pattern being similar to the first pattern, wherein a distance between a center point of the first pattern and a center point of the second pattern corresponds to a dimension of an area of a pattern formed in a single exposure by a lithographic apparatus having a demagnification less than 5×.

16. The apparatus of claim 15, wherein the distance between the center points of the first and second patterns is around 26 mm or around 33 mm.

17. The apparatus of claim 15, wherein the first pattern comprises an area around 26 mm by around 33 mm.

18. The apparatus of claim 15, wherein the first portion and the second portion of the first pattern each comprise an area of around 13 mm by around 33 mm.

19. The apparatus of claim 15, wherein the first and second patterned regions on the patterning device each have an aspect ratio greater than 2:1.

* * * * *